(12) United States Patent
Petrick

(10) Patent No.: US 9,705,509 B1
(45) Date of Patent: Jul. 11, 2017

(54) ALIGNMENT OF SAMPLES ACROSS DIFFERENT CLOCK DOMAINS

(71) Applicant: Oracle International Corporation, Redwood City, CA (US)

(72) Inventor: Bruce E. Petrick, Sunnyvale, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 15/239,591

(22) Filed: Aug. 17, 2016

(51) Int. Cl.
   *H03L 7/00* (2006.01)
   *H03L 7/08* (2006.01)
   *H03M 7/00* (2006.01)

(52) U.S. Cl.
   CPC ............... *H03L 7/08* (2013.01); *H03M 7/00* (2013.01)

(58) Field of Classification Search
   None
   See application file for complete search history.

(56) References Cited

U.S. PATENT DOCUMENTS

| | | | | |
|---|---|---|---|---|
| 7,904,741 B2* | 3/2011 | Baumgartner | ............ | G06F 1/12 713/400 |
| 2004/0119521 A1* | 6/2004 | Kurd | ......................... | G06F 1/10 327/291 |
| 2010/0215091 A1* | 8/2010 | Palmer | .................... | H04L 7/041 375/232 |
| 2012/0314825 A1* | 12/2012 | Dillinger | ................. | H04L 7/033 375/371 |

* cited by examiner

*Primary Examiner* — Cassandra Cox
(74) *Attorney, Agent, or Firm* — Marsh Fischmann & Breyfogle LLP; Daniel J. Sherwinter

(57) ABSTRACT

Embodiments include systems and methods for providing reliable and precise sample alignment across different clock domains. Some embodiments operate in context of microprocessor power management circuits seeking correlated measurements of voltage droop (VD) and phase delay (PD). For example, a rolling code is generated for each of multiple second clock domain sample times (CDSTs). VD and the rolling code are both sampled according to a first clock domain to generate VD samples and corresponding VCode samples for each of multiple first CDSTs. PD can be sampled according to the second clock domain to generate PD samples for each of the second CDSTs, each associated with the rolling code for its second CDST. For any first CDST, the VD sample for the first CDST can be aligned with a PD sample for a coinciding second CDST by identifying matching associated rolling codes.

20 Claims, 4 Drawing Sheets

ALIGNMENT OF SAMPLES ACROSS DIFFERENT CLOCK DOMAINS

FIELD

Embodiments relate generally to integrated circuits, and, more particularly, to techniques for aligning samples from different clock domains.

BACKGROUND

Performance of various types of circuits in a microprocessor can be impacted by changes in characteristics of power to those circuits. Some microprocessors include one or more measurement circuits that can detect such power management issues and can attempt to mitigate related issues. In some such measurement circuits, it is desirable to obtain correlated sample measurements of voltage droop, period jitter, phase delay, and/or other power characteristics. However, such characteristics are typically sampled in different clock domains, and it can be difficult in certain implementations to obtain accurate sample measurements, while maintaining reliable sample correlation across the different clock domains.

BRIEF SUMMARY

Among other things, embodiments provide novel systems and methods for providing reliable and precise sample alignment across different clock domains. Some embodiments operate in context of microprocessor power management circuits seeking correlated measurements of voltage droop and phase delay. Though embodiments are described with reference to phase delay, some implementations actually measure period jitter, which may or may not be correlated with phase delay. For example, embodiments can sample voltage droop (VD) of a circuit according to a first clock domain to generate a VD sample for each of multiple first clock unit intervals (CUIs), and a rolling code (e.g., a reflected binary code, or Gray code) can be sampled according to the first clock domain to generate a VCode sample associable with each VD sample. Phase delay (PD) of the circuit can be sampled according to a second clock domain to generate a PD sample for each of a plurality of second CUIs, and the rolling code can be sampled according to the second clock domain to generate a PCode sample associable with each PD sample. For each first CUI, the VD sample for the first CUI can be output as a synchronized VD output, the VCode associated with the VD output can be identified, one of the PD samples can be identified as having an associated PCode that matches the identified VCode, and the identified PD sample can be output as a synchronized PD output for the first CUI.

BRIEF DESCRIPTION OF THE DRAWINGS

The present disclosure is described in conjunction with the appended figures.

Figure 1:
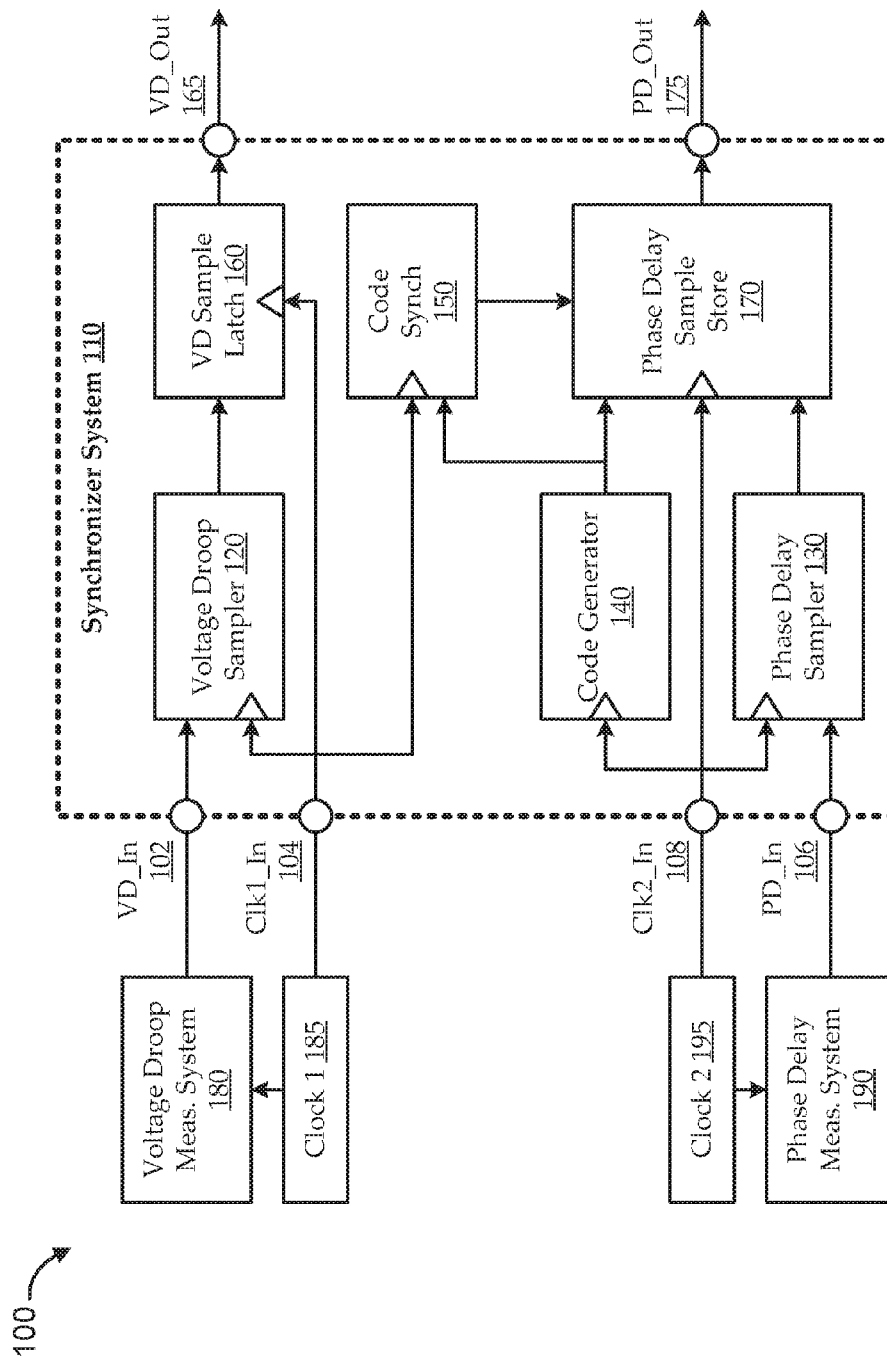
FIG. 1 shows a block diagram of an illustrative inter-domain sample alignment environment, as a context for various embodiments.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

Performance of various types of circuits in a microprocessor (e.g., static random-access memory, SRAM) can be impacted by changes in characteristics of power to those circuits. For example, phase-locked looped (PLLs), and the like, can be distributed around a microprocessor, but the duty cycle, operating frequency, and/or other parameters of those circuits can be sensitive to power management issues, such as voltage droop, phase delay, and other characteristics of power distributed to circuits of the microprocessor. Some microprocessors include one or more measurement circuits (e.g., four, eight, or more such circuits, distributed around the microprocessor) that can detect such power management issues and can attempt to mitigate related issues.

In some such measurement circuits, it is desirable to obtain correlated sample measurements of voltage droop, phase delay, and/or other power characteristics. However, voltage droop is typically sampled according to one clock domain (e.g., a frequency-locked clock), and phase delay is typically sampled according to another clock domain (e.g., a phase-locked clock, or other domain that provides precisely fixed voltage control). For example, voltage droop measurements can be obtained by using a first clock to sample voltage of a particular signal in a circuit as the signal passes through multiple delay lines (e.g., 64 samples obtained at 64 repeaters, encoded into a 6-bit measurement value); and phase delay measurements can be obtained by using a second clock to sample the signal's phase. To obtain accurate phase delay measurements, the second clock can use precisely fixed voltage control (e.g., a stable voltage source), so that only period can jitter from other error sources. Accordingly, the first and second clocks are typically different types of clocks operating in different clock domains. These different clocking domains have conventionally been considered close enough (e.g., within three to ten cycles of each other) to provide sufficient sample correlation. However certain implementations are impractical without more reliable sample correlation across the different clock domains. For example, some power management measurement circuits include multi-stage latches (e.g., first-in-first-out (FIFO) queues, or the like) to avoid certain issues, such as meta-stability issues that can result from asynchronous events entering bi-stable components. Over the multiple latch stages, the different clock domains can cause a loss of sample time correlation between the voltage droop and phase delay samples.

Embodiments are described herein for providing reliable and precise sample alignment across different clock domains. For example, voltage droop (VD) samples can be obtained in a first (e.g., frequency-locked) clock domain in a manner that associates each obtained sample with a VD timecode sample also obtained in the first clock domain. Phase delay (PD) samples can be obtained in a second (e.g., phase-locked) clock domain in a manner that associates each obtained sample with a PD timecode sample also obtained in the second clock domain. The VD and PD samples can be correlated according to their respective associated VD and PD timecodes, thereby aligning the samples.

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

FIG. 1 shows a block diagram of an illustrative inter-domain sample alignment environment 100, as a context for various embodiments. As illustrated, a synchronizer system 110 can include a voltage droop (VD) measurement input 102, a VD clock input 104, a phase delay (PD) measurement input 106, a PD clock input 108, an aligned VD output 165, and an aligned PD output 175. The illustrative synchronization system 110 is described as operating to obtain VD samples according to a first clock domain, to obtain PD samples according to a second clock domain, and to transfer the PD samples to the first clock domain to time-align the VD and PD samples. It will be appreciated that the described embodiments can be adapted to transfer VD samples to the second clock domain and/or to time-align any suitable types of samples from any suitable number of clock domains into any one of multiple clock domains.

As illustrated, the synchronization system 110 can include a voltage droop (VD) sampler structure 120 coupled with (or having) the VD clock input 104 and the VD measurement input 102, and having a VD sample output. The VD clock input 104 can be coupled with a first clock 185 operating in a first clock domain. For example, the first clock 185 can generate a first clock signal in the first clock domain according to a frequency-locked loop (FLL), or the like. The VD measurement input 102 can be coupled with a VD measurement system 180. The VD measurement system 180 can measure circuit signal voltage droop in any suitable manner. For example, the VD measurement system 180 can include delay lines (e.g., repeaters), and voltage samples can be recorded across the delay lines and encoded into a voltage droop measurement output. The VD measurement output can be coupled with the VD measurement input 102 of the synchronization system. The VD sample output can correspond to the VD measurement input 102 sampled at a corresponding VD sample time according to the VD clock input 104. For example, the VD sampler structure 120 can output a VD sample at each clock unit interval (CUI) of the first clock 185.

Embodiments of the synchronization system 110 also include a PD sampler structure 130 coupled with (or having) the PD clock input 108 and the PD measurement input 106, and having a PD sample output. The PD clock input 108 can be coupled with a second clock 195 operating in a second clock domain. For example, the second clock 195 can generate a second clock signal in the second clock domain according to a phase-locked loop (PLL), or the like. Typically, the second clock signal is generated with precisely fixed voltage control to help ensure precise phase measurement. The PD measurement input 106 can be coupled with a PD measurement system 190. The PD measurement system 190 can measure circuit signal phase delay in any suitable manner, for example as movement from a controlled phase reference. The PD sample output can correspond to the PD measurement input 106 sampled at a corresponding PD sample time according to the PD clock input 108. For example, the PD sampler structure 130 can output a VD sample at each clock unit interval (CUI) of the second clock 195.

As described above, the first clock domain is assumed to be different from the second clock domain, and the VD sample output and the PD sample output are assumed to be un-aligned with respect to time (the two clock domains may be close, but still asynchronous with respect to each other). Embodiments of the synchronization system 110 can also include a code generator (CG) structure 140 having a CG clock input coupled with the PD clock input 108 (or otherwise clocked according to the second clock domain in any suitable manner). The CG structure 140 can also include a code output generated at each CUI of the CG clock input. The code output can generally be any suitable code for providing correlation, as described below. For example, the CG structure 140 can include a rolling code generator with enough bits to ensure that each location in a storage array (as described below) can be associated with a unique one of the code outputs. In one implementation, the CG structure 140 includes a reflected binary code generator that outputs a rolling sequence of codes, where each code output differs from the preceding code output by only one bit. A new code output is effectively generated for each CUI of the second clock 195.

Embodiments of the PD sampler structure 130 can include, or be coupled with, a PD sample storage array 170 that operates to store each PD sample output in a respective storage location (e.g., a random access type of storage, where each location corresponds to a possible code output). For example, the storage array can include M storage locations, which can be successively used to store M PD sample outputs, which can be replaced successively by next PD sample outputs. The PD sample storage array 170 can have an index input coupled with the code output of the CG structure 140. For example, for each CUI of the PD clock input 108 (the second clock 195), a PD sample output is received from the PD sampler structure 130, and a code output is received from the CG structure 140; and the received PD sample output is stored in a location of the PD sample storage array 170 in association with the corresponding received code output. In one implementation, each location of the PD sample storage array 170 can be pre-associated with one of multiple possible code output values, and the received PD sample output can be stored in one of the locations selected according to the received code output. In another implementation, the code output can be stored as an index with the stored PD sample output.

Embodiments of the synchronization system 110 can also include a code synchronizer (CS) structure 150 having a CS clock input coupled with (or otherwise time-synchronized with) the VD clock input 104, a code input coupled with the code output, a code sample output, and a code synch output. The code sample output corresponds, at any VD sample time, to the code input sampled at the VD sample time according to the CS clock input. For example, for each CUI of the VD clock input 104 (the first clock 185), the CS structure 150 can output a sample of the code output generated by the CG structure 140. Thus, the code output is effectively a code corresponding to each second CUI, and the code sample output is effectively a sample of that code corresponding to each first CUI.

Circuits having bi-stable components that receive asynchronous events can potentially enter meta-stable states, which can be undesirable. To avoid such meta-stability, outputs can be passed through a multi-stage latch (e.g., to encourage settling). Accordingly, embodiments of the synchronization system 110 can include a VD sample latch 160. As used herein. "latch" is intended generally to include any suitable circuit for temporarily storing sample values according to an input clock, such as one or more flip-flops, or the like. As illustrated, each can be clocked according to the VD clock input 104 (the first clock 185), and can include a queue with an input stage, an output stage, and any suitable number of intermediate stages (e.g., 0 through N). Typically, where there are M locations in the PD sample storage array 170 and N latch stages, N is selected to be less than M. The input stage of the VD sample latch 160 can be coupled with the VD sample output of the VD sampler structure 120; so that when the output of the VD sample latch 160 corresponds to the VD sample output at sample time Ts (corresponding to a particular CUI of the VD clock input 104), the input of the VD sample latch 160 corresponds to the VD sample output at sample time $T_{S+N}$, where there are N latch stages.

Similarly, embodiments of the CS structure 150 can include a multi-stage CS latch to correspond to synchronize the code samples with the VD samples as they propagate through the VD sample latch 160. The input stage of the CS latch can be coupled with the code sample output of the CS structure 150; so that when the output of the CS latch corresponds to the CS output at sample time Ts (corresponding to a particular CUI of the VD clock input 104), the input of the CS latch corresponds to the CS output at sample time $T_{S+N}$ (N CUIs later), where there are N latch stages. The output of the CS latch can be the code synch output of the CS structure 150. Embodiments of the VD sample latch 160 and the CS latch can include the same number of stages, so that the output of the VD sample latch 160 and the code synch output correspond to a same sample time.

In some embodiments, the aligned VD output 165 is coupled with the output of the VD sample latch 160; and the aligned PD output 175 is coupled with the PD sample storage array 170. The PD sample storage array 170 is further coupled with the code synch output (the output of the CS latch). Effectively, at any particular sample time in the second clock domain ($T_P$), a sample of the phase delay measurement (from the PD measurement input 106) is stored in the PD sample storage array 170 in association with a generated code (from the CG structure 140) corresponding to that sample time. If there is a concurrent sample time in the first clock domain ($T_V$), a sample of the voltage droop measurement (from the VD measurement input 102) and a sample of the generated code (from the CG structure 140) for that time are obtained. Notably, the sample of the generated code at $T_V$ (associated with the VD sample output for $T_{S1}$) will be a sample of the code generated for concurrent $T_P$ (which is effectively the index stored with the PD sample output obtained for $T_P$). Embodiments use the code synch output as an index to select one of the stored PD samples in the PD sample storage array 170, which can then be output from the PD sample storage array 170 as the aligned PD output 175. Thus, the aligned PD output 175 corresponds to the code output that also corresponds to the aligned VD output 165 (i.e., to the VD sample output received concurrently with the PD sample output stored in the selected location of the PD sample storage array 170.

Figure 2:
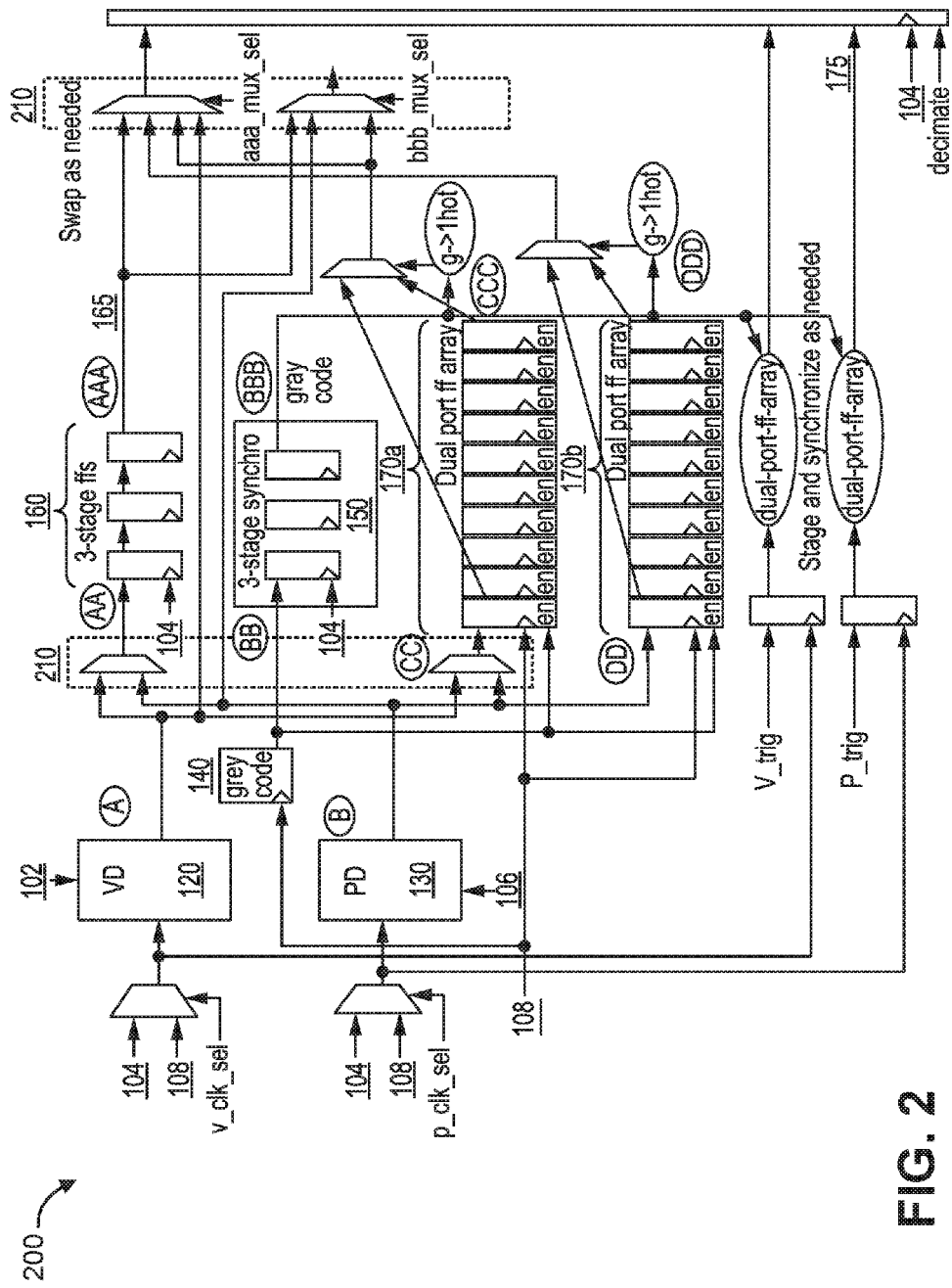
FIG. 2 shows an illustrative circuit implementation of a synchronization system, according to various embodiments.

FIG. 2 shows an illustrative circuit implementation of a synchronization system 200, according to various embodiments. The synchronization system 200 can be an implementation of the synchronization system 110 of FIG. 1 and is labeled with corresponding reference designators for the sake of added clarity. The synchronization system 200 can have various inputs and outputs that can be coupled to external components. For example, a VD clock input 104 and a PD clock input 108 can be coupled with a first clock 185 and a second clock 195, respectively; and a VD measurement input 102 and a PD measurement input 106 can be coupled with a VD measurement system 180 and a PD measurement system 190, respectively.

The illustrated synchronization system 200 is designed to select between multiple configurations. In some implementations, only one configuration is used operationally, and the other configurations are provided for testing purposes. In other implementations, some or all configurations can be used operationally, invoked during diagnostic routines, used during chip testing phases, and/or in any other suitable manner. For example, as shown, each of the VD sampler structure 120 and the PD sampler structure 130 are coupled via a multiplexer, to either the VD clock input 104 (from the first clock 185) or the PD clock input 108 (from the second clock 195), selectable by signals "v_clk_sel" and "p_clk_sel", respectively. Similarly, the PD sample storage array 170 can be selectively coupled to the VD clock input 104 or the PD clock input 108, depending on which clocks are selected for the VD sampler structure 120 and the PD sampler structure 130. Other components, however, such as the VD sample latch 160 and the code sample latch 155, are shown coupled to the VD clock input 104 only (not selectable). Some implementations couple the CG structure 140 only to the PD clock input 108.

Figure 3:
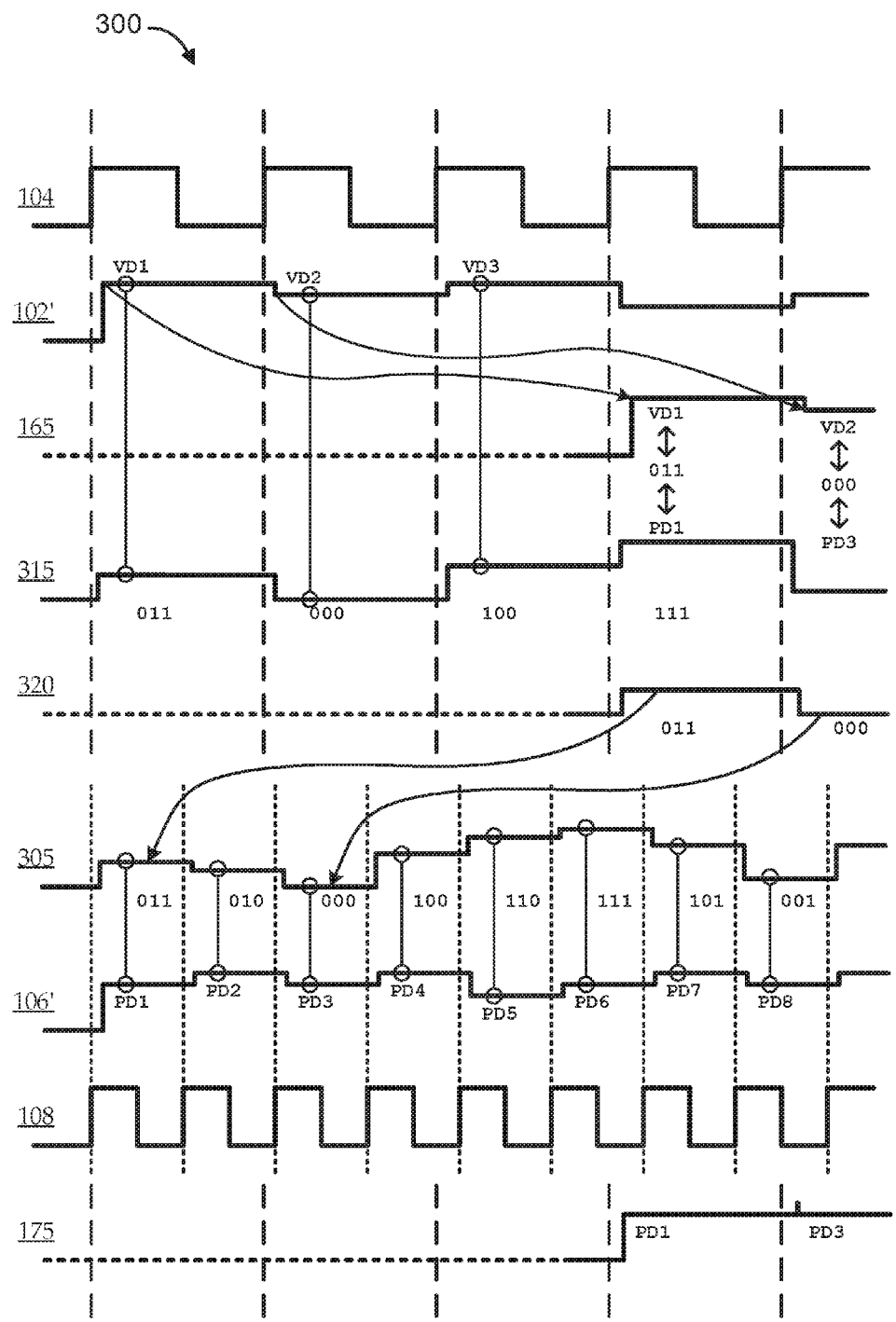
FIG. 3 shows example, simplified signals to illustrate timing for a configuration of the circuit of FIG. 2.

In a first configuration, the multiplexers are set so that the VD sampler structure 120 is clocked according to the VD clock input 104 (the first clock domain), and the PD sampler structure 130 is clocked according to the PD clock input 108 (the second clock domain). For added clarity, this first configuration is described with reference to FIG. 2 and to FIG. 3. FIG. 3 shows example, simplified signals 300 to illustrate timing for such a configuration. In this configuration, other multiplexers are set so that the VD sample output is coupled with the VD sample latch 160, and the PD sample output is coupled with the PD sample storage array 170.

As described with reference to FIG. 1, at a first sample time of the first clock 185 $T_{V1}$ (e.g., a rising edge, a falling edge, etc.), the VD sampler structure 120 can output a first VD sample ($VD_1$) to an input stage (first flip-flop) of a VD sample latch 160 (shown as a three-stage latch). At a second sample time of the first clock 185 $T_{V2}$, the VD sampler structure 120 can output a second VD sample ($VD_2$) to the input stage of the VD sample latch 160, and $VD_1$ can propagate to the second stage of the latch. This can continue, so that, at any given sample time of the first clock 185 $T_{VS}$, the input stage (labeled "AA") of the VD sample latch 160 indicates a present VD sample $VD_S$, and the output stage (labeled "AAA") of the VD sample latch 160 indicates a past VD sample $VD_{S-2}$. For example, FIG. 3 indicates that the output of the VD sample latch 160 (AAA, which can be aligned VD output 165) corresponds to the input of the VD sample latch 160 (AA, which is labeled as 102') from three samples earlier of the VD clock input 104 (for a 3-stage latch).

The code synchronizer (CS) structure 150 can operate in a similar manner to the VD sample latch 160. For example, at any given sample time of the first clock 185 $T_{VS}$, the input stage (labeled "BB") of the CS structure 150 latch indicates a present code sample $C_S$, and the output stage (labeled "BBB") of the CS structure 150 latch indicates a past code sample $C_{S-2}$. Notably, the output at AAA and BBB correspond to a same sample time $T_{VS-2}$. With reference to FIG. 1, the output at AAA can be the aligned VD output 165, and the output at BBB can be the code synch output. For example, FIG. 3 indicates that the output of the CS structure 150 (BBB, which can be the code synch output, and is labeled 320) corresponds to the input of the CS structure 150 (BB, which is labeled as 315) from three samples earlier of the VD clock input 104 (for a 3-stage latch). As shown in FIG. 3, $VD_1$ was sampled in the same sample time of the first clock 185 as was the code '011'; and $VD_2$ was sampled in the same sample time of the first clock 185 as was the code '000'.

In the first configuration, the PD sample storage array 170a is configured to be clocked according to the PD clock input 108 (the second clock domain) and to receive PS sample outputs (also clocked according to the PD clock input 108) from the PD sampler structure 130. Two instances of the PD sample storage array 170a,b are shown to facilitate different configurations, as described below. The PD sample storage arrays 170 are shown as random access arrays of storage locations indexed by possible code output values. At any particular time (e.g., after the eight flip flop locations are filled), each of the flip flops of the PD sample storage array 170a has a PD sample stored in association with a code output corresponding to the sample time at which the PD sample was obtained. The output of the PD sample storage array 170a (labeled as "CCC") corresponds to the PD sample stored in whichever location is also storing the code output that matches the code synch output (from BBB). The output at CCC can be the aligned PD output 175. As described above, in this way, the aligned PD output 175 and the aligned VD output 165 can effectively be time-aligned via the corresponding code value. As described above, using a multi-stage latch for the VD sample latch 160 (and for the CS structure 150) can help avoid meta-stability issues in the PD sample storage array 170. Typically, the number of flip flops in the PD sample storage array 170 (M) is designed to be larger than the number of stages in the VD sample latch 160 (N).

For example, FIG. 3 indicates that, at each sample time of the PD clock input 108, a PD sample is recorded (indicated over time as 106') and an associated code output is recorded (indicated over time as 305) at the input to the PD sample storage array 170. As described above, the code output can be any suitable code, such as a Gray code (signal 305 is intended as one illustrative type of code). The output of the PD sample storage array 170 (CCC, which can be aligned PD output 175) corresponds to whichever PD sample is associated with the code output that matched the code synch output. As shown, the code synch output corresponding to the sample time for $VD_1$ is '011', which corresponds to the storage location of $PD_1$; and the code synch output corresponding to the sample time for $VD_2$ is '000', which corresponds to the storage location of $PD_3$. Thus, the aligned VD output 165 ($VD_1$, $VD_2$, etc.) is time-aligned with the aligned PD output 175 ($PD_1$, $PD_3$, etc.).

In a second configuration of the synchronization system 200, both the VD sampler structure 120 and the PD sampler structure 130 can be coupled (via the multiplexers) to the VD clock input 104. In such a configuration, no synchronization is needed, as the samples are clocked in the same clock domain. In some such implementations, output multiplexers 220 can be set to select directly from the VD sample output and the PD sample output, effectively bypassing the synchronization system 200.

In a third configuration of the synchronization system 200, the multiplexers can be configured to couple the VD sampler structure 120 with the PD clock input 108 and the PD sampler structure 130 with the VD clock input 104 (i.e., swapping clock domains). Input multiplexers 210 can be set, so that the PD sample output is coupled into the VD sample latch 160 (to AA), and the VD sample output is coupled into the PD sample storage array 170 (to CC). The output multiplexers 220 can be set to effectively swap the outputs of the VD sample latch 160 and the PD sample storage array 170 (e.g., the aligned VD output 165 and the aligned PD output 175 are effectively swapped to become the aligned PD output 175 and the aligned VD output 165, respectively).

In a fourth configuration of the synchronization system 200, the both the VD sampler structure 120 and the PD sampler structure 130 can be coupled (via the multiplexers) to the PD clock input 108. In such a configuration, input multiplexers 210 can be set, so that the VD sample output is coupled into the first PD sample storage array 170a (to CC), and the PD sample output is coupled into the second PD sample storage array 170b (to DD). The output multiplexers 220 can be set to effectively read out and swap the outputs of the two PD sample storage arrays 170 (e.g., the output of the first PD sample storage array 170a effectively becomes the aligned VD output 165, and the output of the second PD sample storage array 170b effectively becomes the aligned PD output 175).

The various illustrated configurations are intended only as examples. The illustrated synchronization system 200 is designed to have particular configurations determined to provide operational and diagnostic value without overcomplicating the design. For example, the fourth configuration can alternatively be designed to operate more like the second configuration.

Figure 4:
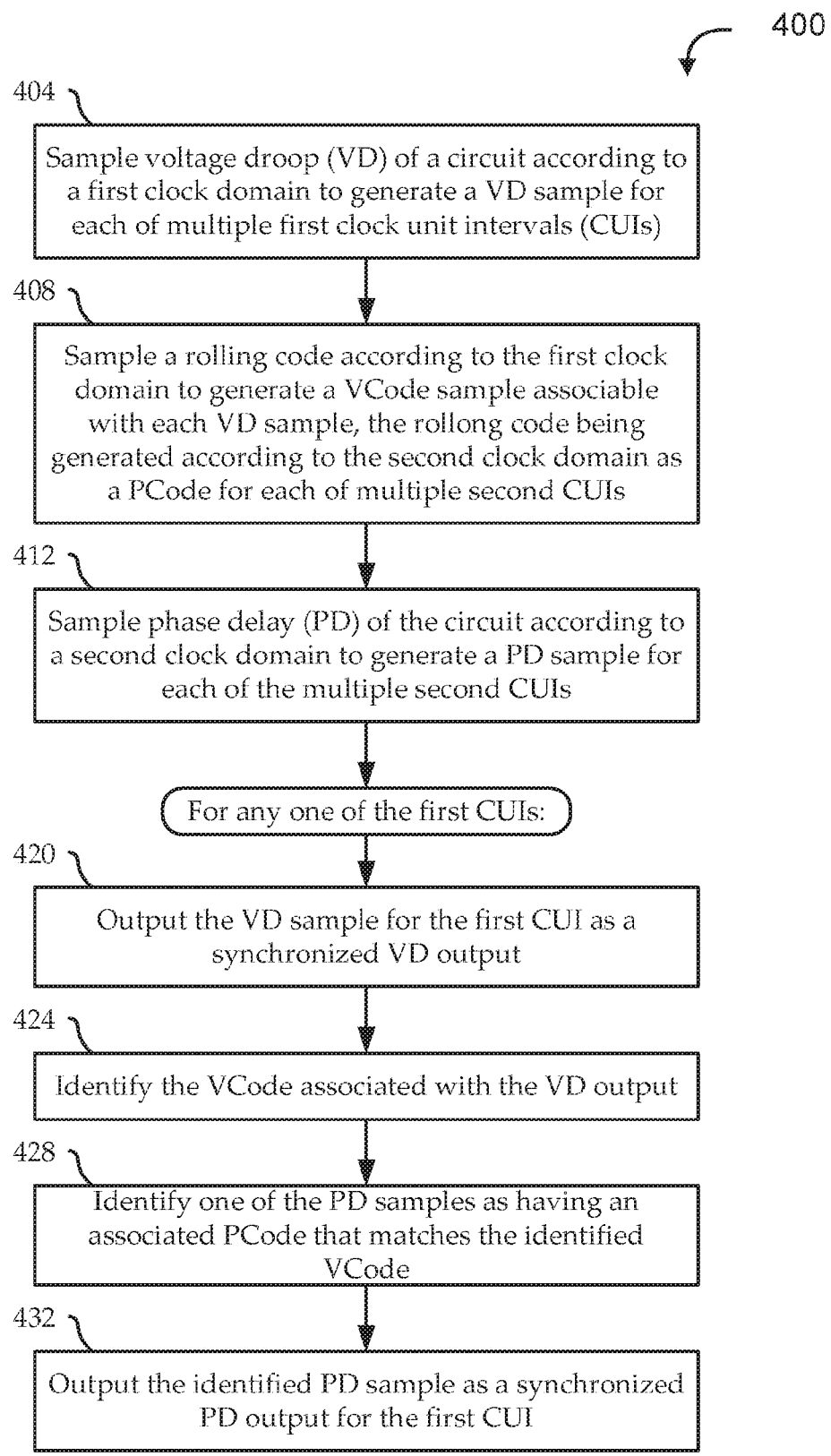
FIG. 4 shows a flow diagram of an illustrative method for time-aligning samples across multiple clock domains, according to various embodiments.

FIG. 4 shows a flow diagram of an illustrative method 400 for time-aligning samples across multiple clock domains, according to various embodiments. Embodiments begin at stage 404 by sampling voltage droop (VD) of a circuit according to a first clock domain to generate a VD sample for each of multiple first clock unit intervals (CUIs). At stage 408, a rolling code can be sampled according to the first clock domain to generate a VCode sample associable with each VD sample. The rolling code can be generated according to a second clock domain as a PCode for each of multiple second CUIs. At stage 412, phase delay (PD) of the circuit can be sampled according to the second clock domain to generate a PD sample for each of the multiple second CUIs, so that each PD sample is associable with the PCode for its second CUI. Embodiments can proceed with stages 420-432 for any particular one (e.g., all) of the first CUIs. At stage 420, embodiments can output the VD sample for the first CUI as an aligned VD output. At stage 424, the VCode associated with the VD output can be identified; and, at stage 428, one of the PD samples can be identified as having an associated PCode that matches the identified VCode. At stage 432, the identified PD sample can be output as an aligned PD output for the first CUI.

Though embodiments are described with reference to voltage droop and phase delay, similar techniques can be used in context of any suitable types of first and second samples in first and second clock domains. For example, embodiments can include any suitable means for generating code synch samples of a rolling code according to a first clock domain, each rolling code generated to correspond to a second clock domain sample time, such that each code synch sample corresponds to a first clock domain sample time and indicates the rolling code generated for the second clock domain sample time that coincides with the corresponding first clock domain sample time. As described herein, such means can include any suitable code generator structure (e.g., including a reflected binary code generator, or the like) and any suitable code synchronizer structure (e.g., including a multi-stage latch, or the like).

Embodiments can also include means for outputting one of a number of first samples, the first samples generated according to the first clock domain, such that the output first sample corresponds to a first clock domain sample time that corresponds to one of the code synch samples. For example, such means can include any suitable sampling structure for sampling measured or other output, latch for holding the samples (e.g., and synchronizing, delaying, etc., as desired), etc. Some such means can further include one or more measurement systems for generating the measurements and/or one or more clocks for generating clock signals according to the first clock domain.

Embodiments can also include means for outputting one of multiple second samples, the second samples generated according to the second clock domain, such that each second sample corresponds to a second clock domain sample time and is associated with the rolling code generated for the corresponding second clock domain sample time, the output second sample being selected from second samples as being associated with the rolling code that matches the one of the code synch samples corresponding to the output first sample. For example, such means can include any suitable sampling structure for sampling measured or other output, storage array for holding the samples in association with rolling code indexes, etc. Some such means can further include one or more measurement systems for generating the measurements and/or one or more clocks for generating clock signals according to the second clock domain. The various means described above can further include multiplexers and or other components for changing the configuration of the system, as desired (e.g., as described with reference to FIG. 2).

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The steps of a method or algorithm or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A synchronizer system comprising:
   a voltage droop (VD) sampler structure having:
     a VD clock input clocked according to a first clock domain;
     a VD measurement input; and
     a VD sample output that corresponds to the VD measurement input sampled at a corresponding VD sample time according to the VD clock input;
   a code generator (CG) structure having:
     a CG clock input clocked according to a second clock domain; and
     a code output generated at each clock unit interval of the CG clock input;
   a code sampler (CS) structure having:
     a CS clock input time-synchronized with the VD clock input;
     a code input coupled with the code output; and
     a CS output that corresponds, at any VD sample time, to the code input sampled at the VD sample time according to the CS clock input;
   a phase delay (PD) sampler structure having:
     a PD clock input time-synchronized with the CG clock input;
     a PD measurement input;
     a CS input coupled with the CS output;
     a storage array that operates to store a sequence of PD samples of the PD measurement input, so that each PD sample is sampled at an associated PD sample time of the PD clock input, and each is stored in association with the code output generated at the clock unit interval corresponding to the associated PD sample time; and
     a PD output that corresponds, at any VD sample time, with the PD sample stored in association with the code output that matches the CS input.

2. The synchronizer system of claim 1, further comprising:
a first clock operating at the first clock domain and coupled with the VD clock input and with the CS clock input.

3. The synchronizer system of claim 1, wherein:
the first clock domain is maintained by a frequency-locked loop; and
the second clock domain is maintained by a phase-locked loop.

4. The synchronizer system of claim 1, wherein the VD sampler structure further comprises:
a VD latch circuit clocked according to the VD clock input and comprising N stages, including:
a VD latch input stage coupled with the VD measurement input; and
a VD latch output stage coupled with the VD sample output,
such that, at any VD sample time ($T_S$), the VD sample output corresponds to the VD measurement input sampled at $T_S$, and the VD latch input stage corresponds to the VD measurement input sampled at $T_{S+N}$.

5. The synchronizer system of claim 4, wherein the code sampler structure further comprises:
a CS latch circuit clocked according to the VD clock input and comprising N stages, including:
a CS latch input stage coupled with the code input; and
a CS latch output stage coupled with the CS output,
such that, at $T_S$, the CS output corresponds to the code input sampled at $T_S$, and the CS latch input stage corresponds to the code input sampled at $T_{S+N}$.

6. The synchronizer system of claim 4, wherein:
the storage array stores M PD samples, and M>N.

7. The synchronizer system of claim 1, further comprising:
a voltage droop measurement structure having a VD measurement output corresponding to a measured voltage droop across a delay line in an integrated circuit, the VD measurement output coupled with the VD measurement input.

8. The synchronizer system of claim 1, wherein the code output is generated according to a revolving reflected binary code.

9. An integrated circuit comprising a plurality of instances of the synchronizer system of claim 1.

10. A method for aligning samples across multiple clock domains, the method comprising:
sampling voltage droop (VD) of a circuit according to a first clock domain to generate a VD sample for each of a plurality of first clock unit intervals (CUIs);
sampling a rolling code according to the first clock domain to generate a VCode sample associable with each VD sample, the rolling code generated according to the second clock domain as a PCode sample for each of a plurality of second CUIs;
sampling phase delay (PD) of the circuit according to a second clock domain to generate a PD sample for each of the plurality of second CUIs, so that each PD sample is associable with a corresponding PCode for its second CUI;
for any of the first CUIs:
outputting the VD sample for the first CUI as an aligned VD output;
identifying the VCode associated with the VD output;
identifying one of the PD samples as having an associated PCode that matches the identified VCode; and
outputting the identified PD sample as an aligned PD output for the first CUI.

11. The method of claim 10, wherein:
the first clock domain is maintained by a frequency-locked loop; and
the second clock domain is maintained by a phase-locked loop.

12. The method of claim 10, wherein:
sampling the VD of the circuit comprises communicating the VD sample for the first CUI at a first VD sample time ($T_S$) to an input stage of a VD latch having N stages; and
outputting the VD sample for the first CUI as the aligned VD output comprises outputting the VD sample from an output stage of the VD latch at a subsequent VD sample time ($T_{S+N}$).

13. The method of claim 12, wherein:
sampling the rolling code comprises communicating the VCode sample for the first CUI at a first VD sample time (Ts) to an input stage of a CS latch having N stages; and
identifying the VCode associated with the VD output comprises outputting the VCode sample from an output stage of the CS latch at the subsequent VD sample time ($T_{S+N}$).

14. The method of claim 10, wherein:
sampling the PD of the circuit comprises storing M PD samples in a storage array, each of the M PD samples corresponding to a respective one of M second CUIs, and each of the M PD samples stored in association with the PCode for the respective second CUI.

15. The method of claim 10, wherein:
the rolling code is a reflected binary code.

16. A system for aligning samples across multiple clock domains, the system comprising:
means for generating a plurality of code synch samples of a rolling code according to a first clock domain, each rolling code generated to correspond to a second clock domain sample time, such that each code synch sample corresponds to a first clock domain sample time and indicates the rolling code generated for the second clock domain sample time that coincides with the corresponding first clock domain sample time; and
means for outputting one of a plurality of first samples, the first samples generated according to the first clock domain, such that the output first sample corresponds to a first clock domain sample time that corresponds to one of the code synch samples;
means for outputting one of a plurality of second samples, the second samples generated according to the second clock domain, such that each second sample corresponds to a second clock domain sample time and is associated with the rolling code generated for the corresponding second clock domain sample time, the output second sample being selected from the plurality of second samples as being associated with the rolling code that matches the one of the code synch samples corresponding to the output first sample.

17. The system of claim 16, wherein:
the first clock domain is maintained by a frequency-locked loop; and
the second clock domain is maintained by a phase-locked loop.

18. The system of claim 16, wherein:
the plurality of first samples are samples of voltage droop measurements of a circuit; and the plurality of second samples are samples of phase delay measurements of the circuit.

19. The system of claim 16, further comprising:

means for selecting between at least two modes, wherein, in the first mode, the plurality of first samples are samples of voltage droop measurements of a circuit, and the plurality of second samples are samples of phase delay measurements of the circuit, and in the second mode, the plurality of first samples are samples of phase delay measurements of the circuit, and the plurality of second samples are samples of voltage droop measurements of the circuit.

20. The system of claim 16, wherein:

the rolling code is a reflected binary code.

* * * * *

UNITED STATES PATENT AND TRADEMARK OFFICE
CERTIFICATE OF CORRECTION

PATENT NO. : 9,705,509 B1
APPLICATION NO. : 15/239591
DATED : July 11, 2017
INVENTOR(S) : Petrick Page 1 of 1

It is certified that error appears in the above-identified patent and that said Letters Patent is hereby corrected as shown below:

In the Drawings

On sheet 4 of 4, in FIG. 4, under Reference Numeral 408, Line 3, delete "rollong" and insert -- rolling --, therefor.

In the Specification

In Column 5, Line 2, delete "herein." and insert -- herein, --, therefor.

In Column 5, Line 14, delete "Ts" and insert -- $T_S$ --, therefor.

In Column 5, Line 25, delete "Ts" and insert -- $T_S$ --, therefor.

In Column 9, Line 31, delete "and or" and insert -- and/or --, therefor.

In the Claims

In Column 12, Line 21, in Claim 13, delete "(Ts)" and insert -- ($T_S$) --, therefor.

Signed and Sealed this
Tenth Day of July, 2018

Andrei Iancu
*Director of the United States Patent and Trademark Office*